(12) United States Patent
Ziegler et al.

(10) Patent No.: US 10,143,105 B1
(45) Date of Patent: Nov. 27, 2018

(54) RE-USABLE MODULAR SKID ASSEMBLY FOR SHIPPING ELECTRONIC MODULES

(71) Applicant: SCHNEIDER ELECTRIC IT CORPORATION, West Kingston, RI (US)

(72) Inventors: William Ziegler, Reading, MA (US); Louis Perry, Acton, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/698,209

(22) Filed: Sep. 7, 2017

(51) Int. Cl.
| | |
|---|---|
| *H05K 7/00* | (2006.01) |
| *H05K 7/14* | (2006.01) |
| *H02B 1/20* | (2006.01) |
| *H02B 1/30* | (2006.01) |
| *H01F 27/06* | (2006.01) |
| *H05K 7/02* | (2006.01) |

(52) U.S. Cl.
CPC .......... *H05K 7/1497* (2013.01); *H01F 27/06* (2013.01); *H02B 1/205* (2013.01); *H02B 1/30* (2013.01); *H05K 7/026* (2013.01); *H05K 7/1457* (2013.01); *H05K 7/1489* (2013.01); *H05K 7/1492* (2013.01)

(58) Field of Classification Search
CPC .... H05K 7/1497; H05K 7/026; H05K 7/1489; H01F 27/06; H02B 1/30; H02B 1/205; B65D 19/0012; B65D 19/0044; B65D 19/42; B65D 19/00
USPC ........ 52/79.5; 248/346.01, 346.5; 108/51.11, 108/57.16, 57.17, 57.22; 220/592
See application file for complete search history.

(56) References Cited

U.S. PATENT DOCUMENTS

| | | | | |
|---|---|---|---|---|
| 2,572,348 | A * | 10/1951 | Johnson | B65D 19/42 108/57.15 |
| 2,933,339 | A * | 4/1960 | Alvden | B65D 19/0069 108/57.17 |
| 8,210,488 | B2 * | 7/2012 | Small | F16M 5/00 108/51.11 |
| 8,681,479 | B2 | 3/2014 | Englert et al. | |
| 9,192,069 | B2 | 11/2015 | Emert et al. | |
| 9,219,384 | B2 | 12/2015 | Emert et al. | |
| 9,337,688 | B2 | 5/2016 | Englert et al. | |
| 9,398,717 | B2 | 7/2016 | Englert et al. | |
| 9,431,798 | B2 | 8/2016 | Englert et al. | |
| 9,480,176 | B2 | 10/2016 | Englert et al. | |

(Continued)

*Primary Examiner* — Patrick J Maestri
(74) *Attorney, Agent, or Firm* — Lando & Anastasi, LLP

(57) ABSTRACT

A modular skid assembly is configured to transport a modular electrical component on a platform with removable stabilizing means. The modular skid assembly includes a plate having an upper surface configured to support the modular electrical component. A first side beam extends longitudinally along one side of the plate, and is secured to the plate. A second side beam extends longitudinally along an opposite side of the plate, and is secured to the plate. A plurality of joists extend laterally beneath the plate, extending between the first side beam and the second side beam. A first stabilizing means is configured to be releasably secured to the first side beam, and a second stabilizing means is configured to be releasably secured to the second side beam. The first and second stabilizing means are only required during hoisting, positioning, and transporting of the platform.

22 Claims, 12 Drawing Sheets

(56) References Cited

U.S. PATENT DOCUMENTS

2004/0099187 A1* 5/2004 Cox, Jr. .............. B65D 88/005
                                                    108/51.11
2018/0042133 A1   2/2018 Ziegler et al.

* cited by examiner

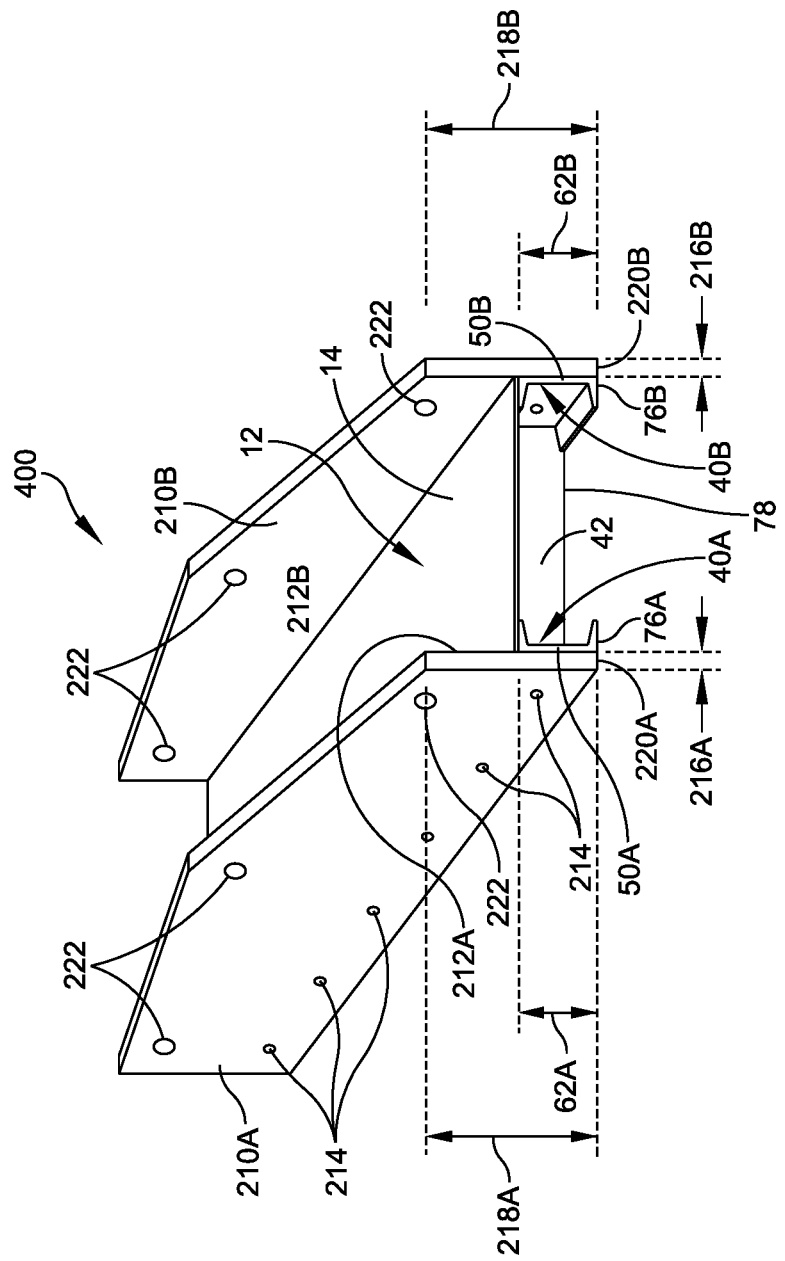

RE-USABLE MODULAR SKID ASSEMBLY FOR SHIPPING ELECTRONIC MODULES

FIELD OF THE INVENTION OF THE DISCLOSURE

The present disclosure is directed to a modular skid assembly for pre-fabricated (pre-fab) data center modules that include electrical components arranged on a platform and are shipped to an end-use site.

BACKGROUND OF THE DISCLOSURE

Pre-fabricated data center modules typically require a platform or enclosure on which to mount electrical components. This platform should have sufficient strength and rigidity to withstand the loads and forces during hoisting, positioning, and transporting the module. Existing power module skid designs use a significant amount of welded structural steel to support the weight of electrical components supported by the power module skid. Much of the structure is needed only when hoisting and transporting the skid. Once the unit is placed into position on a floor or pad at the site, the heavy platform structure is typically no longer required as there is a foundation or pad to support the load. The platform is then used to anchor the electrical components.

In prior skids, there are several thousand extra pounds of steel to purchase, fabricate, hoist, ship and install. In addition, the base of the prior skids has a height that provides the strength required for hoisting, positioning, and transporting, which makes access to the electrical components on the skid more difficult and sometimes requires extra platforms, railings or steps for accessibility or to meet code-mandated heights for actuator access.

SUMMARY OF THE DISCLOSURE

One aspect of the present disclosure is directed to a modular skid assembly that is configured to transport a modular electrical component. In some embodiments, the modular skid assembly comprises a plate including an upper surface configured to support the modular electrical component. A first side beam extends longitudinally along one side of the plate. The first side beam is secured to the plate. A second side beam extends longitudinally along an opposite side of the plate. The second side beam is secured to the plate. A plurality of joists extend laterally beneath the plate. The plurality of joists extend between the first side beam and the second side beam. A first shipping beam is configured to be releasably secured to the first side beam. A second shipping beam is configured to be releasably secured to the second side beam.

In some embodiments, each of the first side beam and the second side beam includes a C-channel beam, and each of the first shipping beam and the second shipping beam includes a C-channel beam. The first shipping beam is positioned adjacent to the first side beam and the second shipping beam is positioned adjacent to the second side beam.

In some embodiments, a lower flange of the first shipping beam extends laterally in an opposite direction to a lower flange of the first side beam, and a lower flange of the second shipping beam extends laterally in an opposite direction to a lower flange of the second side beam.

In some embodiments, a lower surface of the lower flange of the first shipping beam is flush with the lower flange of the first side beam, and a lower surface of the lower flange of the second shipping beam is flush with the lower flange of the second side beam.

In some embodiments, each of the first and second side beams is welded to the plate, and each of the plurality of joists is welded to the first side beam and the second side beam.

In some embodiments, the first shipping beam is releasably securable to the first side beam via a first plurality of first fasteners, and the second shipping beam is releasably securable to the second side beam via a second plurality of second fasteners.

In some embodiments, the at least one electrical component is bolted to the plate.

In some embodiments, the first shipping beam and the second shipping beam each further include at least one lifting lug.

In some embodiments, the first shipping beam and the second shipping beam each further include lashing members.

In some embodiments, the modular skid assembly further comprises a first end beam and a second end beam. The first end beam is secured to a first gusset that is secured to a first end of the first shipping beam, and the first end beam is secured to a second gusset that is secured to a first end of the second shipping beam. The second end beam is secured to a third gusset that is secured to a second end of the first shipping beam. The second end beam is secured to a fourth gusset that is secured to a second end of the second shipping beam. Each end beam is secured to a respective end plate that is secured to a respective end of the plate.

In some embodiments, a first cleat is formed on the first shipping beam and is configured to engage a first recess defined in the first side beam when the first shipping beam is secured to the first side beam, and a second cleat is formed on the second shipping beam and is configured to engage a second recess defined in the second side beam when the second shipping beam is secured to the second side beam.

In some embodiments, the modular skid assembly further comprises four wheels, each wheel secured to a respective one of four corners of the assembly. Each wheel is vertically adjustable with respect to the plate.

In some embodiments, a modular skid assembly is configured to transport a modular electrical component, and the modular skid assembly comprises a plate including an upper surface configured to support the modular electrical component; a first side beam extending longitudinally along one side of the plate, the first side beam being secured to the plate; a second side beam extending longitudinally along an opposite side of the plate, the second side beam being secured to the plate; a plurality of joists extending laterally beneath the plate, the plurality of joists extending between the first side beam and the second side beam; a first stabilizing means configured to be releasably secured to the first side beam; and a second stabilizing means configured to be releasably secured to the second side beam.

In some embodiments, a lower surface of the first stabilizing means is flush with a lower surface of the first side beam, and a lower surface of the second stabilizing means is flush with a lower surface of the second side beam.

In some embodiments, the first and second side beams are welded to the plate, and the plurality of joists are welded to the first side beam and the second side beam.

In some embodiments, the first stabilizing means is releasably securable to the first side beam via a first plurality of fasteners, and the second stabilizing means is releasably securable to the second side beam via a second plurality of fasteners.

In some embodiments, the at least one electrical component is bolted to the plate.

In some embodiments, the first stabilizing means and the second stabilizing means each further include at least one lifting lug.

In some embodiments, the first stabilizing means and the second stabilizing means each further include lashing members.

In some embodiments, the first stabilizing means is a first shipping plate and the second stabilizing means is a second shipping plate.

Another aspect of the present disclosure is directed to a method of transporting a modular component. In some embodiments, the method comprises providing a modular skid assembly configured to transport a modular electrical component, the modular skid assembly comprising a plate including an upper surface configured to support the modular electrical component, a first side beam extending longitudinally along one side of the plate, the first side beam being secured to the plate, a second side beam extending longitudinally along an opposite side of the plate, the second side beam being secured to the plate, a plurality of joists extending laterally beneath the plate, the plurality of joists extending between the first side beam and the second side beam, a first shipping beam configured to be releasably secured to the first side beam, and a second shipping beam configured to be releasably secured to the second side beam. In some embodiments, the method further includes securing a modular electrical component to the plate of the modular skid assembly, securing the first shipping beam to the first side beam, and securing the second shipping beam to the second side beam.

In some embodiments, a lifting device is secured to a first lifting lug associated with the first shipping beam and to a second lifting lug associated with the second shipping beam.

In some embodiments, the method includes removing the second shipping beam from the second side beam, removing the first shipping beam from the first side beam.

In some embodiments, the method includes unsecuring the modular electrical component from the plate.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 11 is a perspective view of another embodiment of a skid assembly; and

DETAILED DESCRIPTION OF THE DISCLOSURE

The present disclosure relates generally to a skid for supporting electrical components both during shipping of the electrical components and during use of the electrical components at the site of the end user. Specifically, embodiments of the present disclosure are described below with reference to a modular skid assembly that has a platform to support electrical components during use by the end user and at least one stabilizing structure to support the platform during hoisting, positioning, and transporting of the platform.

The modular skid assembly of the present disclosure can be partially disassembled after hoisting and transporting, and is more cost effective than previous skids.

The present disclosure provides a modular skid assembly that is separated into multiple sections that are releasably fastened together during assembly and then disassembled after installation on site where the electrical components that are supported on a section of the skid are intended to be used. A first section of the modular skid assembly is the platform to which one or more pieces of pre-fabricated electrical components are mounted. This first section anchors the components and remains part of the product for the life of the installation of the platform and electrical components on site. A second section (or multiple second sections) of the modular skid assembly includes re-useable structural parts. The second section(s) attach to the platform and provide temporary strength and rigidity for hoisting, transporting and positioning of the platform. Once the assembly is positioned on site, the second section(s) are unfastened and disassembled from the platform and are returned for reuse on another project.

Figure 1:
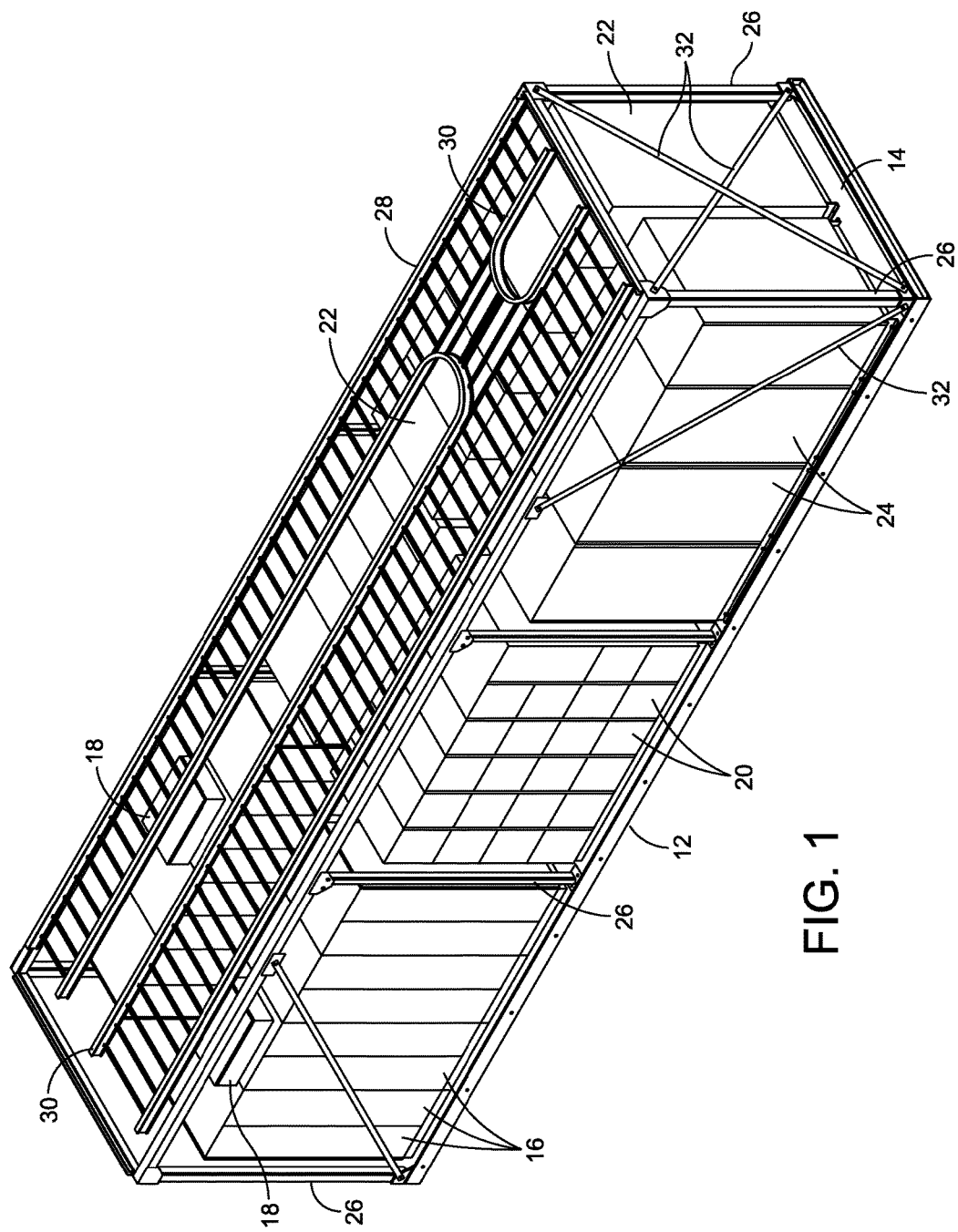
FIG. 1 is a perspective view of a platform that has been installed on site, without power cables and other cables shown.
Figure 4:
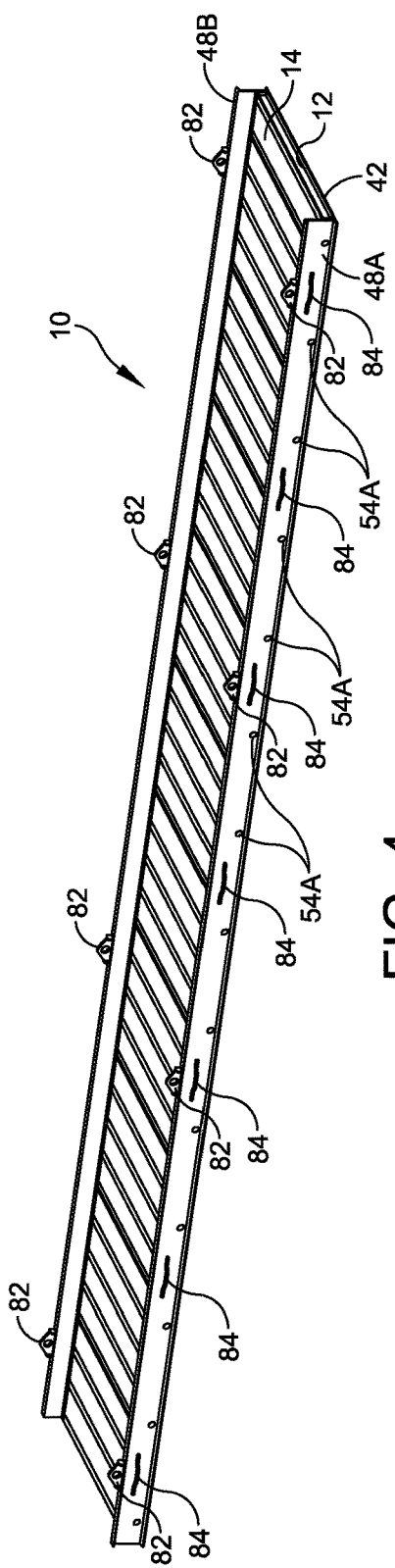
FIG. 4 is a perspective view of the embodiment of the platform shown in FIG. 3, with shipping beams secured to the platform to form a first embodiment of a skid assembly.

Referring now to the drawings, FIG. 1 shows a platform 12 of a of a re-usable modular skid assembly, which is generally indicated at 10 in FIG. 4, that has been installed on site, without power cables and other cables shown. In one exemplary configuration, the platform 12 includes a plate 14 with an upper surface that supports electrical components, such as several battery cabinets, each indicated at 16, several battery breaker control boxes, each indicated at 18, several uninterruptible power supply (UPS) cabinets, each indicated at 20, several input switchgear cabinets, each indicated at 22, and several output switchgear cabinets 24. Four posts, each indicated at 26, are included at corners of the platform 12. Each post 26 extends vertically from the platform 12 to support a cable ladder support 28 positioned above the platform 12 and above the electrical components. Cable ladders, each indicated at 30, are secured to the cable ladder support 28, and are useful to guide cables from an external power supply or other external electrical components to the electrical components that are supported on the platform. Shipping straps 32 are each secured at a first (lower) end to the platform 12 and at a second (upper) end to the cable ladder support 28. The shipping straps 32 improve stability of the platform 12 and cable ladder support 28 during hoisting, positioning, and transporting of the platform 12. Additional shipping straps can be provided to further stabilize the platform 12.

Figure 2:
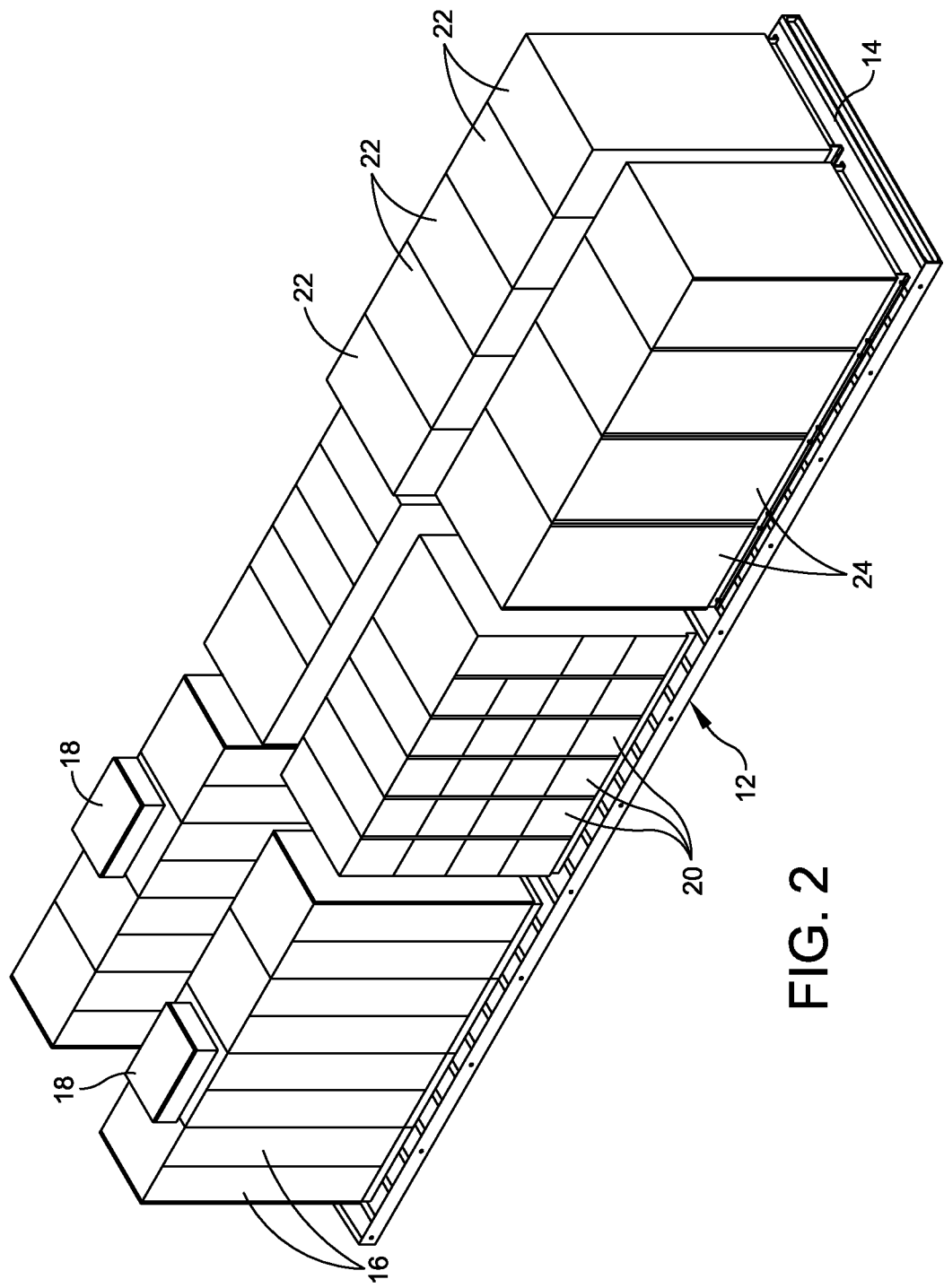
FIG. 2 is a perspective view thereof, without cable ladders and other components shown.

FIG. 2 shows the platform 12 of the modular skid assembly 10 and the electrical components without the posts 26, cable ladder support 28, and cable ladders 30 secured to the platform 12. The electrical components are secured to the upper surface of the plate 14 of the platform 12. For example, in some embodiments, each electrical component is secured by fasteners to the plate 14 so the respective electrical components are secured to the platform 12 during hoisting, positioning, and transporting of the platform 12 and electrical components.

FIGS. 3-7 show the embodiment of the modular skid assembly 10 of FIGS. 1 and 2 of the present disclosure in further detail. Generally, the modular skid assembly 10 is configured to transport and support at least one modular electrical component, and includes at least one stabilizing structure that is releasably securable to a platform 12.

Figure 3:
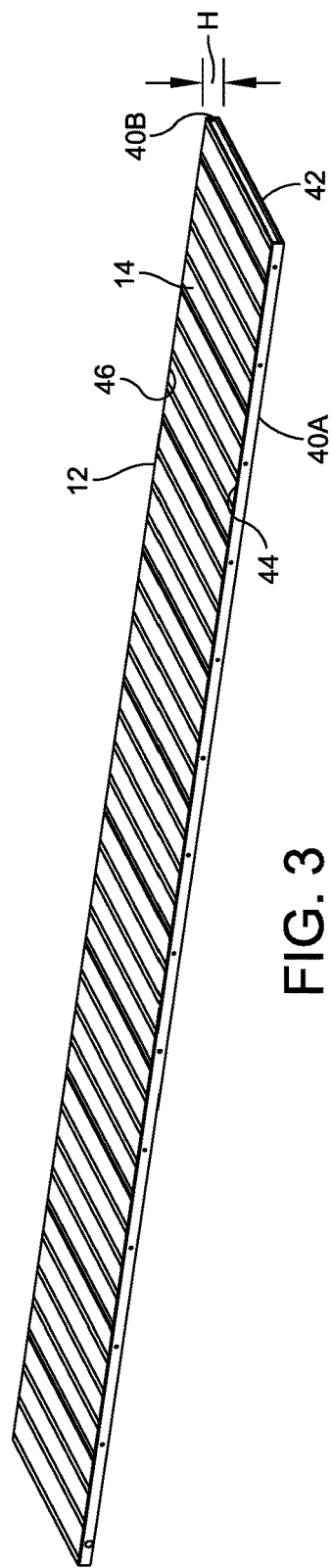
FIG. 3 is a perspective view of a platform of an embodiment of a modular skid assembly.

FIG. 3 shows the platform 12 of the modular skid assembly 10 before electrical components have been secured to the platform 12. The plate 14 of the platform 12 includes an upper surface configured to support the modular electrical components (e.g., components 16, 18, 20, 22 and 24). When the platform 12 is installed on site, the plate 14 is supported on its sides by two side beams 40A, 40B and several joists 42 extending crosswise beneath the plate 14. A first side beam, e.g., side beam 40A, extends longitudinally along one side 44 of the plate 14. The first side beam 40A is secured to the plate 14 by a suitable method, which will be described below. A second side beam, e.g., side beam 40B, extends longitudinally along an opposite side 46 of the plate 14. The second side beam 40B is secured to the plate 14. The joists 42 extend laterally beneath the plate 14, and extend between the first side beam 40A and the second side beam 40B.

FIG. 4 shows the platform 12 with a first shipping beam 48A and a second shipping beam 48B secured to the platform 12. The first shipping beam 48A is releasably secured to the first side beam 40A of the platform 12. The second shipping beam 48B is releasably secured to the second side beam 40B of the platform 12. In this embodiment of the modular skid assembly 10, the first side beam 40A is a C-channel beam, and the second side beam 40B is a C-channel beam. The first shipping beam 48A is a C-channel beam, and the second shipping beam 48B is a C-channel beam. A web of the first shipping beam 48A is positioned adjacent to a web of the first side beam 40A, and a web of the second shipping beam 48B is positioned adjacent to a web of the second side beam 40B.

Figure 5A:
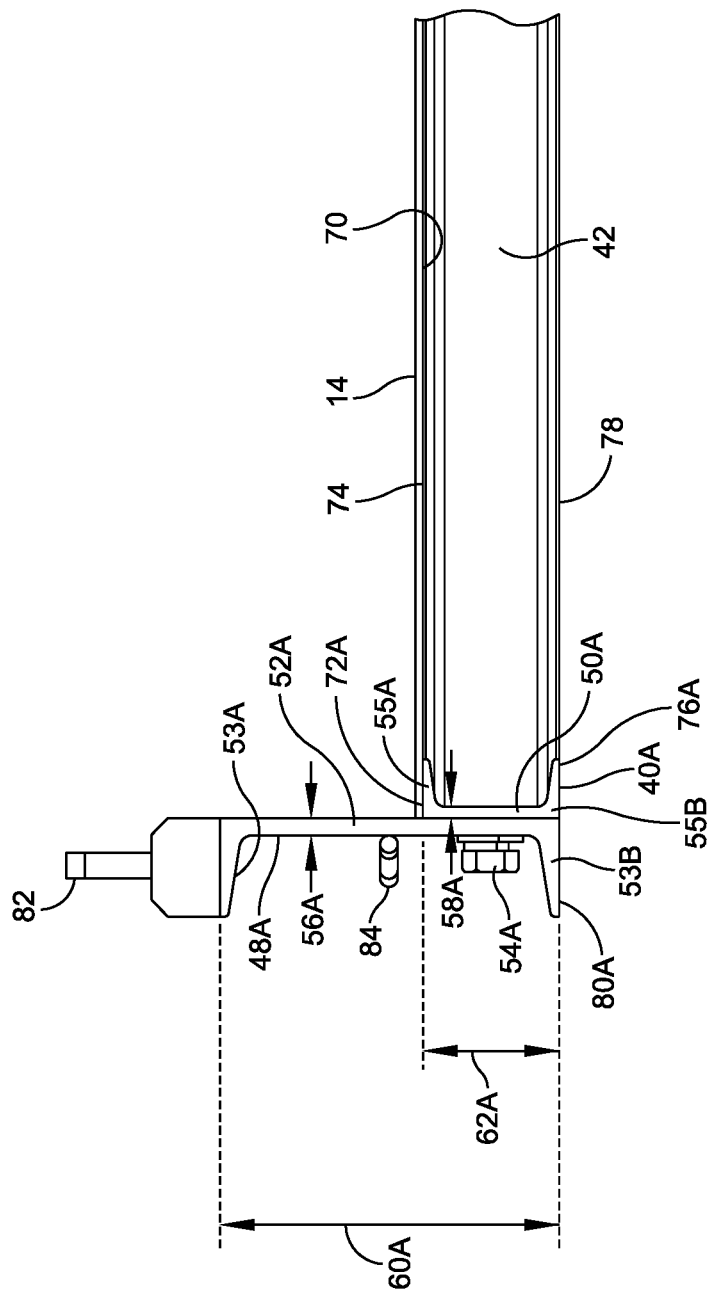
FIG. 5A is an end view of the platform of FIG. 4 showing a first side.
Figure 5B:
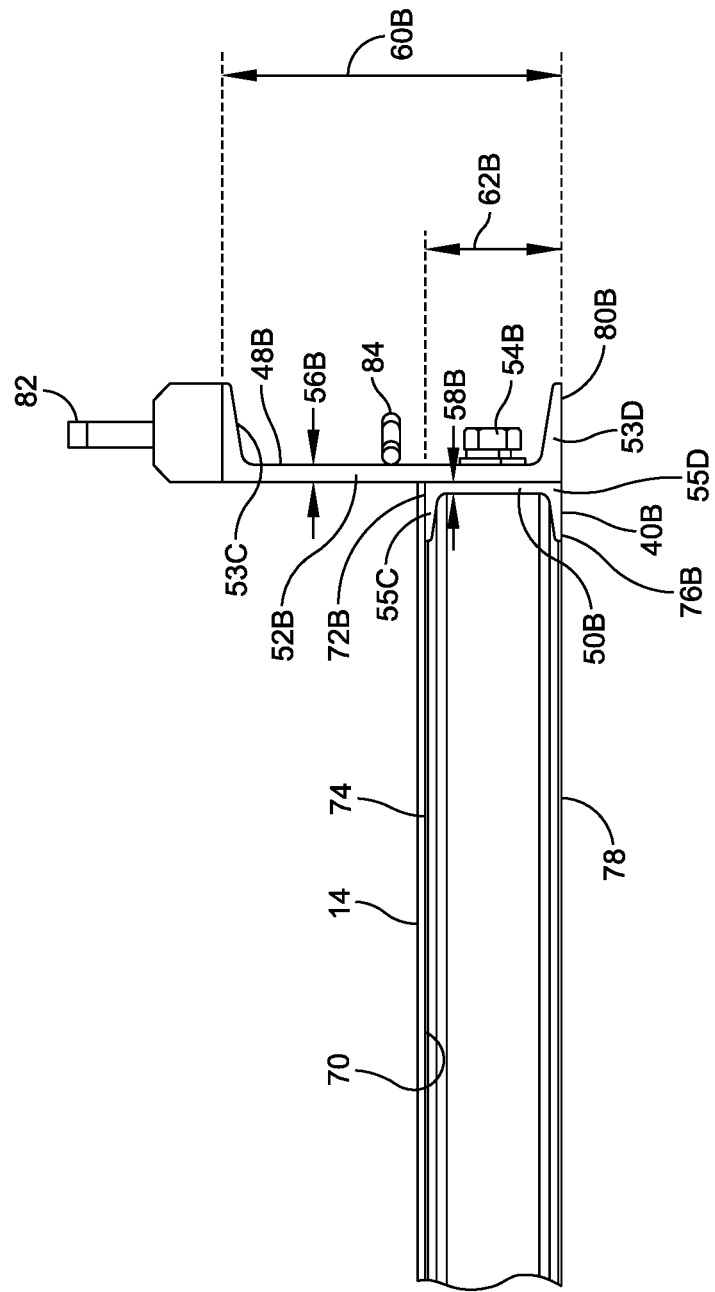
FIG. 5B is an end view of the platform of FIG. 4 showing a second side.

FIGS. 5A and 5B show end views of FIG. 4. FIGS. 5A and 5B show that when the first shipping beam 48A is secured to the first side beam 40A, a web 50A of the first side beam 40A is directly adjacent a web 52A of the first shipping beam 48A. Similarly, when the second shipping beam 48B is secured to the second side beam 40B, a web 50B of the second side beam 40B is directly adjacent a web 52B of the second shipping beam 48B.

The upper and lower flanges 53A, 53B of the first shipping beam 48A extend laterally in an opposite direction to the upper and lower flanges 55A, 55B of the first side beam 40A, and the upper and lower flanges 53C, 53D of the second shipping beam 48B extend laterally in an opposite direction to the upper and lower flanges 55C, 55D of the second side beam 40B.

Figure 6:
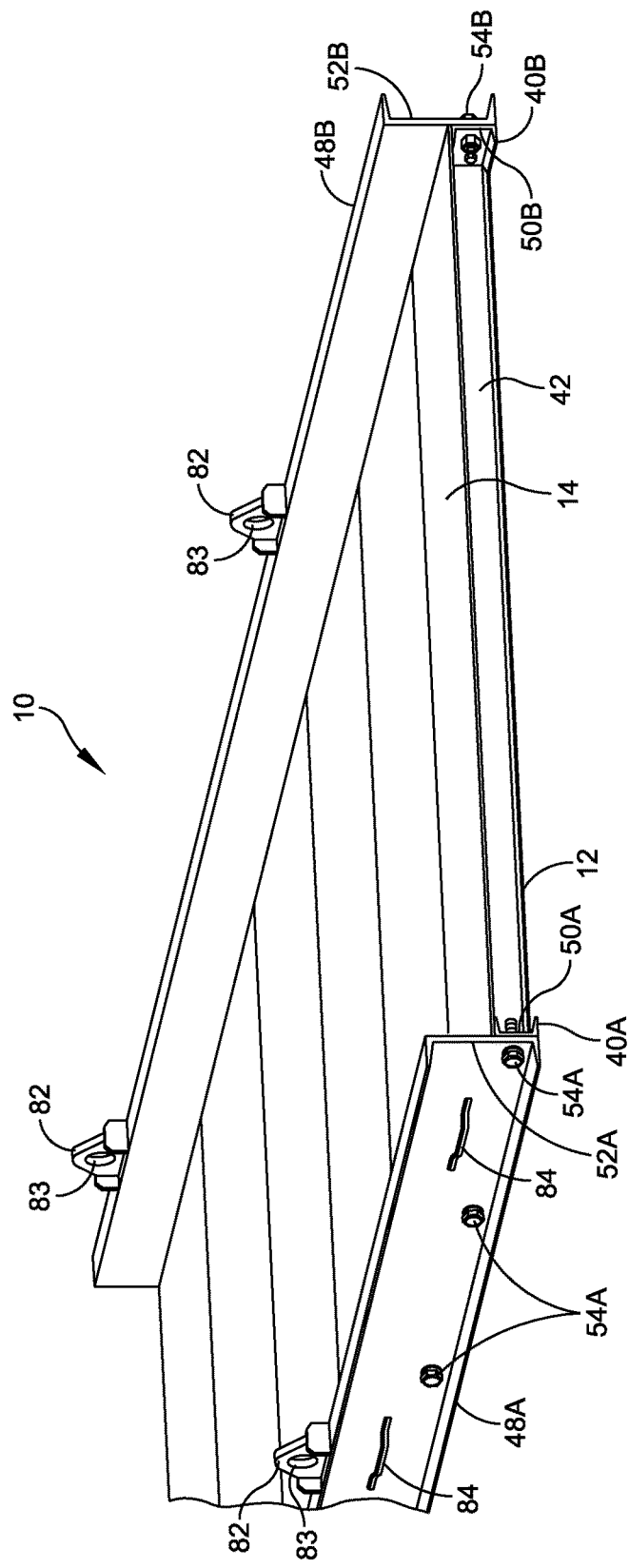
FIG. 6 is a perspective sectional view of the platform of FIG. 4.

The first shipping beam 48A is releasably securable to the first side beam 40A by several first fasteners, each indicated at 54A, which are shown at spaced apart locations along the length of the first shipping beam 48A in FIG. 6. Because the web 50A of the first side beam 40A is directly adjacent and fastened to the web 52A of the first shipping beam 48A, the first shipping beam 48A improves the stability of the first side beam 40A during hoisting, positioning, and transportation of the platform 12. A thickness 56A of the web 52A of the first shipping beam 48A and the flanges 53A of the first shipping beam 48A provide increased resistance to bending loads applied to the first side beam 40A due to the weight of electrical components on the upper surface of the plate 14. The thickness 56A of the web 52A of the first shipping beam 48A is greater than a thickness 58A of the web 50A of the first side beam 40A, and a height 60A of the first shipping beam 48A is greater than a height 62A of the first side beam 40A.

Similarly, the second shipping beam 48B is releasably securable to the second side beam 40B by several second fasteners, each indicated at 54B, at spaced apart locations along the length of the second shipping beam 48B. Because the web 50B of the second side beam 40B is directly adjacent and fastened to the web 52B of the second shipping beam 48B, the second shipping beam 48B improves the stability of the second side beam 40B during hoisting, positioning, and transportation of the platform 12. A thickness 56B of the web 52B of the second shipping beam 48B and the flanges 53B of the second shipping beam provide increased resistance to bending loads applied to the second side beam 40B due to the weight of electrical components on the upper surface of the plate 14. The thickness 56B of the web 52B of the second shipping beam 48B is greater than a thickness 58B of the web 50B of the second side beam 40B, and a height 60B of the second shipping beam 48B is greater than a height 62B of the second side beam 40B.

In the embodiment of FIGS. 3-7, the first side beam 40A is welded to one side, e.g., side 44, of the plate 14, and the second side beam 40B is welded to the opposite side, e.g., side 46, of the plate 14. Each of the joists 42 is welded to the first side beam 40A and to the second side beam 40B. Each of the joists 42 is also welded to the plate 14. A lower surface 70 of the plate 14 directly engages an upper surface 72A of the first side beam 40A, an upper surface 72B of the second side beam 40B, and an upper surface 74 of each joist 42. The weight of the platform 12 and the electrical components is supported on the support surface by a lower surface 76A of the first side beam 40A, a lower surface 76B of the second side beam 40B, and a lower surface 78 of each joist 42.

A lower surface 80A of the first shipping beam 48A is flush with the lower surface 76A of the first side beam 40A and the respective lower surface 78 of each joist 42. Similarly, a lower surface 80B of the second shipping beam 48B is flush with the lower surface 76B of the second side beam 40B and the respective lower surface 78 of each joist 42. Because of this geometry, when the modular skid assembly 10 is moved into position on site, the lower surface 80A of the first shipping beam 48A, the lower surface 80B of the second shipping beam 48B, the lower surface 76A of the first side beam 40A, the lower surface 76B of the second side beam 40B, and the respective lower surface 78 of each joist 42 each engages the support surface of the end-use site. The first shipping beam 48A can then be released from the first side beam 40A by removing the fasteners 54A, and the second shipping beam 48B can be released from the second side beam 40B by removing the fasteners 54B.

In FIG. 6, each of the first fasteners 54A includes a bolt threadably secured to a nut, and each of the second fasteners 54B includes a bolt threadably secured to a nut. In other embodiments, other types of fasteners can be used as the first fasteners 54A and the second fasteners 54B.

The first shipping beam 48A and the second shipping beam 48B are each configured to be hoisted. The first shipping beam 48A further includes several lifting lugs, each indicated at 82, positioned along a length of the first shipping beam. The second shipping beam further includes several lifting lugs 82 positioned along a length of the second shipping beam. Each lifting lug 82 includes an aperture 83 configured to receive a hook to allow a user to hoist the modular skid by connecting the lifting lugs to a hoisting device, such as a crane.

The first shipping beam 48A and the second shipping beam 48B are each configured to be secured to a vehicle during transportation of the modular skid assembly 10. The first shipping beam 48A includes several lashing members, each indicated at 84, and the second shipping beam 48B includes several lashing members that are similar to lashing members 84. Each lashing member 84 on the first shipping beam 48A is formed as an elongated member having a first end secured to the first shipping beam 48A and a second end secured to the first shipping beam 48A, so that a strap or hook can be secured to a middle portion of the elongated member 84. Similarly, each lashing member, which as mentioned above is similar or identical to lashing members 84, on the second shipping beam 48B is formed as an elongated member having a first end secured to the second shipping beam 48B and a second end secured to the second shipping beam 48B, so that a strap or hook can be secured to a middle portion of the lashing member. The lashing members 84 enable a user to tie down the modular skid assembly 10 to a flatbed surface on a truck to transport of the modular skid assembly.

Figure 7:
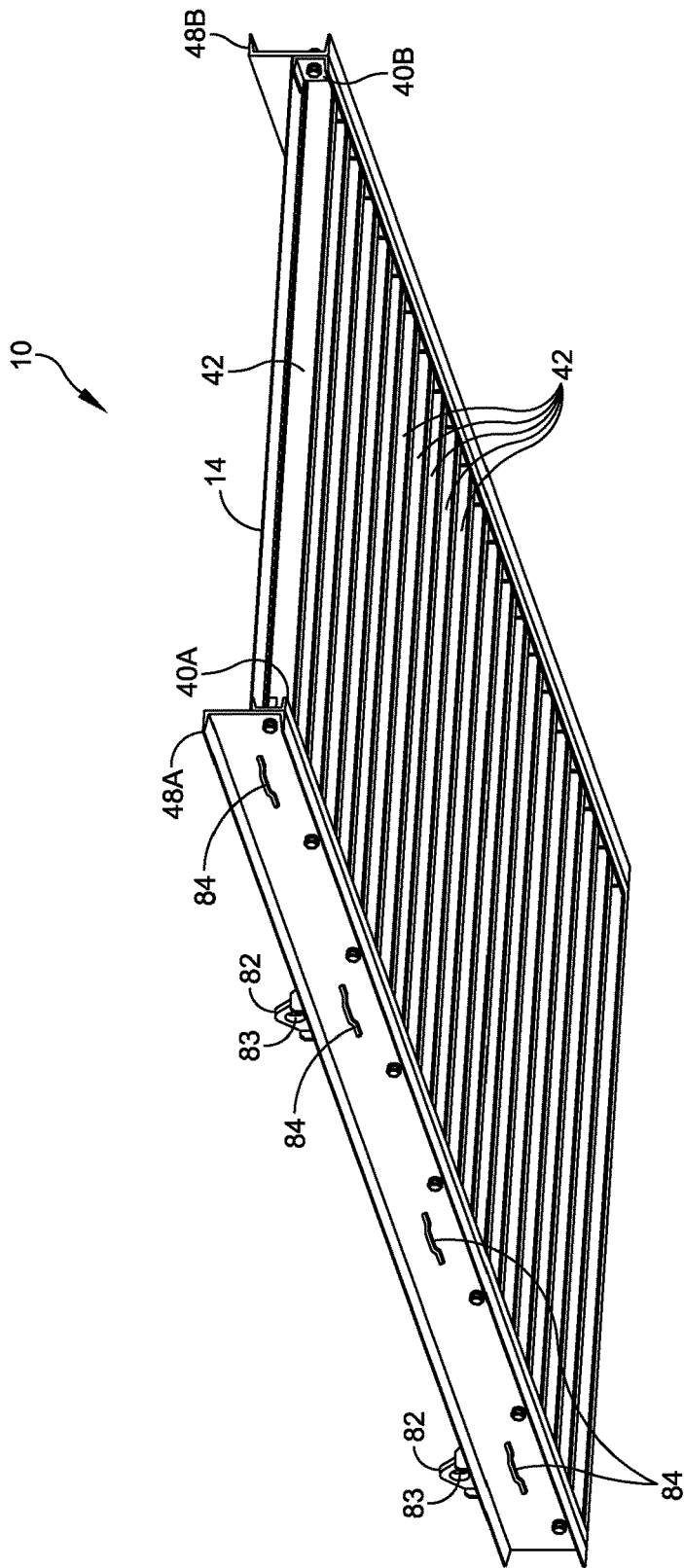
FIG. 7 is a perspective sectional view of the platform of FIG. 4 taken from a different perspective.

FIG. 7 shows the plurality of joists 42 spaced apart longitudinally underneath the lower surface of the plate 14 of the platform.

In the embodiment of FIGS. 3-7, the plate 14 is 0.25 inch thick, and is made of steel. Each joist 42 is an I-beam that is 4 inches high and weighs 7.7 pounds per foot. The first side beam 40A is a C-channel beam that is 4 inches high and weighs 7.25 pounds per foot. Similarly, the second side beam 40B is a C-channel beam that is 4 inches high and weighs 7.25 pounds per foot. The first shipping beam 48A is a C-channel beam that is 10 inches high and weighs 25 pounds per foot. The second shipping beam 48B is a C-channel beam that is 10 inches high and weighs 25 pounds per foot.

In other embodiments, other beams can be used in place of the shipping beams, depending on the weight of the electrical components.

In another aspect of the present disclosure, a modular skid assembly configured to transport a modular electrical component includes a platform, a first stabilizing structure (a first stabilizing means), and a second stabilizing structure (a second stabilizing means). The platform of the modular skid assembly includes a plate having an upper surface configured to support the modular electrical component. The platform includes a first side beam, a second side beam, and several joists. The first side beam extends longitudinally along one side of the plate, and is secured to the plate. The second side beam extends longitudinally along an opposite side of the plate, and is secured to the plate. The joists extend laterally beneath the plate, and extend between the first side beam and the second side beam. A first stabilizing structure and a second stabilizing structure are each releasably securable to the platform. For example, in some embodiments, the first stabilizing structure is releasably secured to the first side beam, and the second stabilizing structure is releasably secured to the second side beam.

The first stabilizing structure and the second stabilizing structure can be C-channel beams, beams with square cross-sections, beams with L-shaped cross sections, beams with other cross-sections, or other stabilizing structure. In other embodiments, each of the first stabilizing structure and the second stabilizing structure is a rail.

In some embodiments, the lower surface of the first stabilizing structure is flush with a lower surface of the first side beam, and a lower surface of the second stabilizing structure is flush with a lower surface of the second side beam.

In some embodiments, the first side beam and the second side beam are welded to the plate, and each of the joists is welded to the first side beam and the second side beam.

In some embodiments, the first stabilizing structure is releasably securable to the first side beam by several fasteners, and the second stabilizing structure is releasably securable to the second side beam via a second plurality of fasteners. In some embodiments, the first plurality of fasteners is a first plurality of bolts and the second plurality of fasteners is a second plurality of bolts.

In some embodiments, the first stabilizing structure and the second stabilizing structure each further include at least one lifting lug. In some embodiments, the first stabilizing structure and the second stabilizing structure each further include one or more lashing members.

In some embodiments, at least one electrical component is bolted to the plate.

Figure 8:
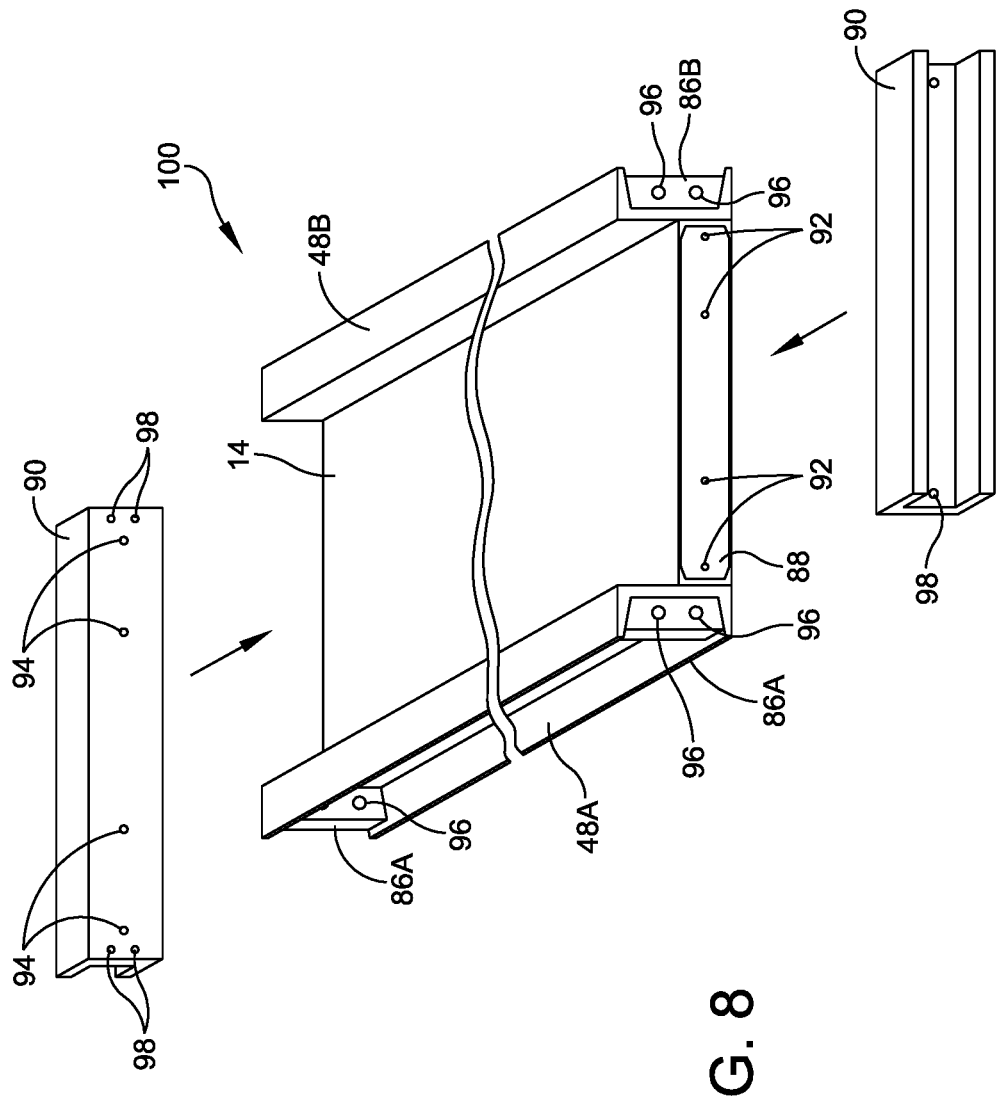
FIG. 8 is a partially exploded view of another embodiment of a skid assembly.

FIG. 8 shows a partially exploded view of a skid assembly, generally indicated at 100, which includes all of the features of the modular skid assembly 10 of FIGS. 3-7, and includes additional features. A gusset 86A is secured, for example by a weld, to a first end of the first shipping beam 48A, and a gusset 86A is secured, for example by a weld, to a second end of the first shipping beam 48A. Each gusset 86A is flush with the respective end of the first shipping beam 48A. Similarly, a gusset 86B is secured, for example by a weld, to a first end of the second shipping beam 48B, and a gusset, similar to gusset 86B is secured, for example by a weld, to a second end of the second shipping beam 48B. Each gusset 86B is flush with the respective end of the second shipping beam 48B. A first end plate 88 is secured, for example by a weld, to a first end of the plate 14, and a second end plate, similar to end plate 88 is secured, for example by a weld, to a second end of the plate 14. A first end beam 90 is secured to the first end plate 88, and a second end beam 90 is secured to the second end plate. Each end beam 90 is secured to one of the gussets 86A on the first shipping beam 48A and is also secured to one of the gussets 86B on the second shipping beam 48B. To secure one of the end beams 90 to a respective one of the end plates 88, a plurality of fasteners are provided, with each fastener extending through one of a plurality of apertures 92 on the respective end plate 88 and through one of a plurality of apertures 94 on the respective end beam 90. To secure one of the end beams 90 to a respective one of the gussets 86A, 86B, a plurality of fasteners is provided, with each fastener extending through one of a plurality of apertures extending through one of a plurality of apertures 96 on the respective gusset 86A, 86B and through one of a plurality of apertures 98 on the respective end beam 90.

The end beams 90 improve the resistance of the skid assembly 100 to twisting. In other embodiments, different beams or additional beams are used to tie the first side beam 40A and the second side beam 40B to prevent twisting.

Figure 9:
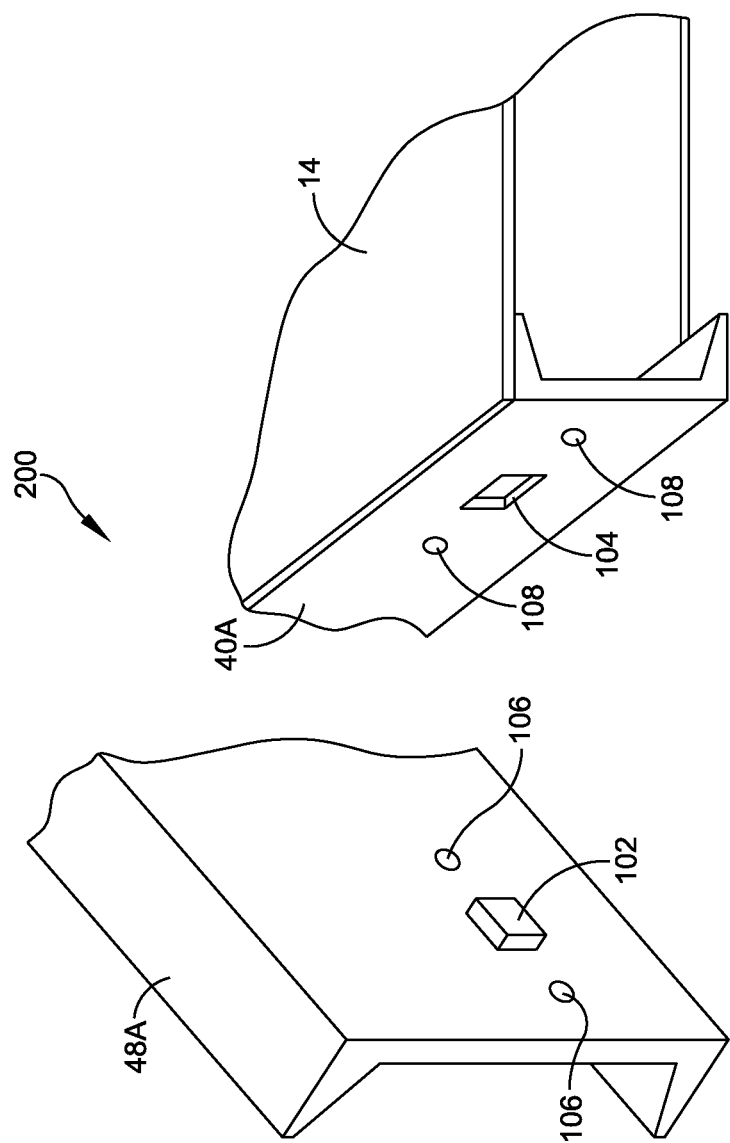
FIG. 9 is a partially exploded view of a portion of another embodiment of a skid assembly.

FIG. 9 shows a skid assembly 200, which includes all of the features of the modular skid assembly 10 of FIGS. 3-7, and includes cleats formed on the shipping beams. FIG. 9 shows a portion of the first shipping beam 48A and a portion of the first side beam 40A. A cleat 102 is shown protruding from a longitudinal surface of the shipping beam 48A. When the first shipping beam 48A is secured to the first side beam 40A by the first fasteners 54A, the cleat 102 is received in a recess 104 defined on a longitudinal surface of the first side beam 40A. The placement of the cleat 102 within the recess 104 is designed to reduce the shear stress on the first fasteners 54A that extend through apertures 106 on the first shipping beam 48A and through the apertures 108 on the first side beam 40A to connect the first shipping beam 48A to the first side beam 40A. Similarly, a cleat can be formed on the second shipping beam 48B to engage a recess defined in the second side beam 40B when the second shipping beam is secured to the second side beam, wherein the engagement of the cleat with the recess is designed to reduce the shear stress on the set of second fasteners 54B that connect the second shipping beam 48B to the second side beam 40B.

In some embodiments, a plurality of cleats are formed on the first shipping beam 48A and a plurality of recesses are defined on the first side beam 40A. Each respective cleat of the plurality of cleats formed on the first shipping beam 48A is received in a respective recess of the plurality of recesses defined on the first side beam 40A. Similarly, in some embodiments, a plurality of cleats are formed on the second shipping beam 48B and a plurality of recesses are defined on the second side beam 40B. Each respective cleat of the plurality of cleats formed on the second shipping beam 48B is received in a respective recess of the plurality of recesses defined on the second side beam 40B.

In some embodiments, the cleats predominantly support the vertical load between the respective side beam and the respective shipping beam. In some embodiments, each cleat is formed by a pin or plate that is welded to the respective shipping beam.

At least some embodiments of the skid assembly of the present disclosure can be loaded on a truck and slid off of the truck onto an end-use site. Some embodiments include wheels to facilitate this.

Figure 10A:
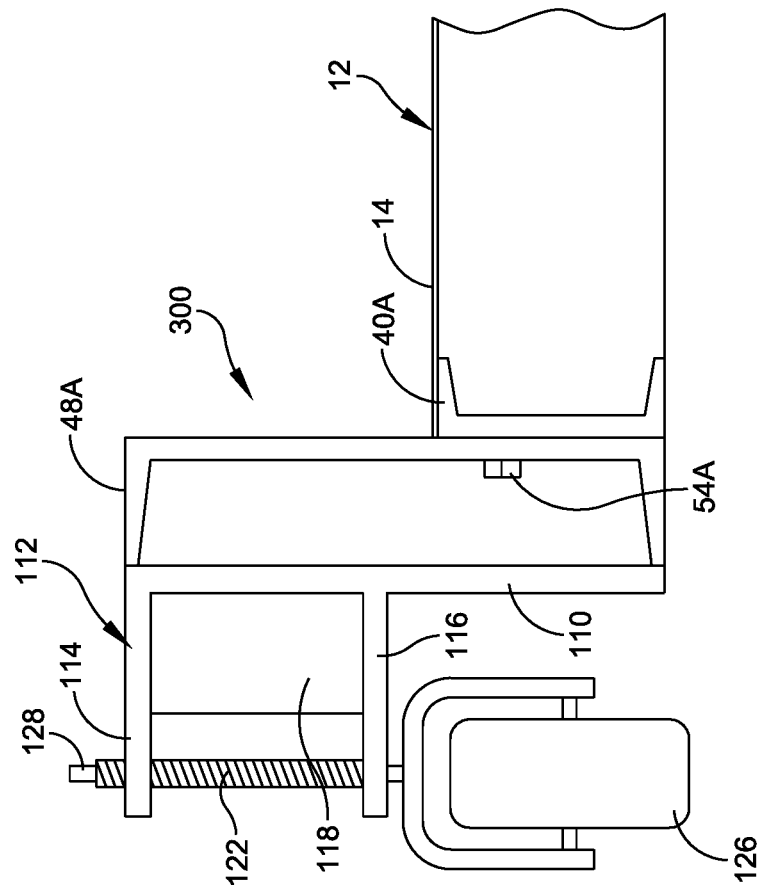
FIG. 10A is a partial front view of another embodiment of a skid assembly.
Figure 10B:
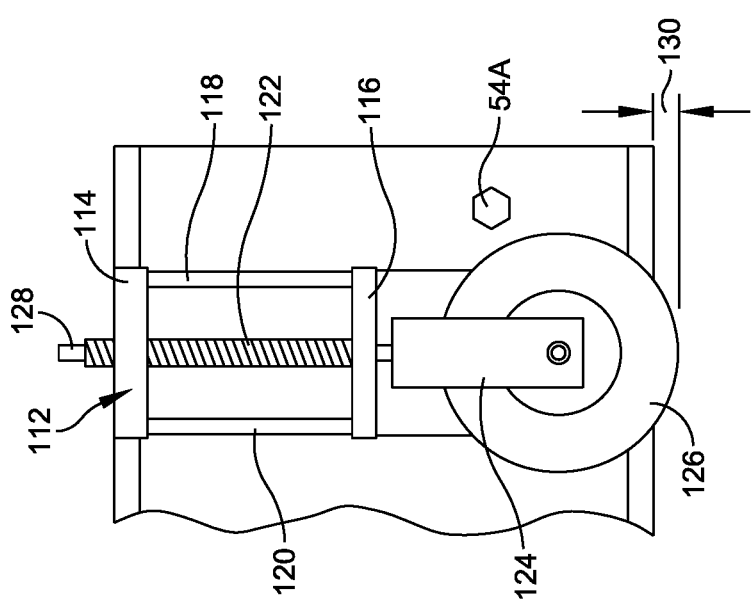
FIG. 10B is a partial side view of another embodiment of a skid assembly.

FIGS. 10A and 10B show a skid assembly 300, which includes all of the features of the modular skid assembly 10 of FIGS. 3-7, and includes wheels.

Referring to FIG. 10A, a partial view of the skid assembly 300 shows the first shipping beam 48A secured to the platform 12. The first side beam 40A and the plate 14 of the platform 12 are shown. A wheel support plate 110 is secured to the first shipping beam 48A, for example, by welding.

Referring to FIG. 10B, a box 112 is secured to the wheel support plate 110. The box 112 includes an upper wall 114, a lower wall, 116, a first side wall 118 and a second side wall 120. A threaded shaft 122 extends through a threaded aperture in the upper wall 114 and an aperture in the lower wall. A caster 124 includes a wheel 126, which is pivotally secured to a lower end of the threaded shaft 122. The height of plate 14 with respect to a support surface on which the skid assembly 300 is positioned is adjustable by engaging a wrench with an upper end 128 of the threaded shaft 122 to rotate the threaded shaft with respect to the upper wall 114.

In some embodiments, an alternative wheel height adjustment mechanism is provided to allow a user to adjust the height of the platform with respect to a support surface on which the skid assembly is supported by the wheels.

In one embodiment, four wheels are provided, each wheel secured to a respective one of four corners of the assembly, and each wheel being vertically adjustable with respect to the plate 14. For example, two wheels are supported at opposite ends of the first shipping beam 48A and two wheels are supported at opposite ends of the second shipping beam 48B. When each respective threaded shaft 122 is rotated to an orientation such that there is a clearance 130 between the lower surface of the first shipping beam 48A and the lower edge of the wheels supported on the first shipping beam 48A, and such that there is a clearance between the lower surface of the second shipping beam 48B and the lower edge of the wheels supported on the second shipping beam, a user may roll the skid assembly 300 along the support surface. After the platform 12 has been moved to the desired position on the support surface, a user may rotate each threaded shaft 122 to lower the platform 12 onto the support surface. Once the platform 12 is directly resting on the support surface, the plurality of first fasteners 54A securing the first shipping beam 48A to the first side beam 40A may be removed and the plurality of second fasteners 54B securing the second shipping beam 48B to the second side beam 40B may be removed.

In some embodiments, a number of wheels other than four are provided.

FIG. 11 shows a modular skid assembly 400 including the platform 12 of FIG. 3 with a first shipping plate 210A and a second shipping plate 210B secured to the platform 12. The first shipping plate 210A is releasably secured to the first side beam 40A of the platform 12. The second shipping plate 210B is releasably secured to the second side beam 40B of the platform 12. In this embodiment of the modular skid assembly 400, the first side beam 40A is a C-channel beam, and the second side beam 40B is a C-channel beam. The first shipping plate 210A is a heavy plate having a constant thickness (or at least a substantially constant thickness), and the second shipping plate 210B is a heavy plate having a constant thickness (or at least a substantially constant thickness).

FIG. 11 shows that when the first shipping plate 210A is secured to the first side beam 40A, a web 50A of the first side beam 40A is directly adjacent a longitudinal surface 212A of the first shipping plate 210A. Similarly, when the second shipping plate 210B is secured to the second side beam 40B, a web 50B of the second side beam 40B is directly adjacent a longitudinal surface 212B of the second shipping plate 210B. A plurality of fasteners, each indicated at 214, secure the first shipping plate 210A to the first side beam 40A. Similarly, a plurality of fasteners secure the second shipping plate 210B to the second side beam 40B.

The height of the shipping plate 210A provides improved bending strength to the skid assembly 400. Similarly, the height of the second shipping plate 210B provides improved bending strength to the skid assembly 400.

Because the web 50A of the first side beam 40A is directly adjacent and fastened to the longitudinal surface 212A of the first shipping plate 210A, the first shipping plate 210A improves the stability of the first side beam 40A during hoisting, positioning, and transportation of the platform 12. A thickness 216A of the first shipping plate 210A and a height 218A of the first shipping plate provide increased resistance to bending loads applied to the first side beam 40A due to the weight of electrical components on the upper surface of the plate 14. The thickness 216A of the first shipping plate 210A is greater than a thickness 58A of the web 50A of the first side beam 40A, and a height 218A of the first shipping plate 210A is greater than a height 62A of the first side beam 40A.

Similarly, the second shipping plate 210B is releasably securable to the second side beam 40B by several second fasteners, not shown, which are at spaced apart locations along the length of the second shipping plate 210B. Because the web 50B of the second side beam 40B is directly adjacent and fastened to the longitudinal surface 212B of the second shipping plate 210B, the second shipping plate 210B improves the stability of the second side beam 40B during hoisting, positioning, and transportation of the platform 12. A thickness 216B of the second shipping plate 210B and a height 218B of the second shipping plate provide increased resistance to bending loads applied to the second side beam 40B due to the weight of electrical components on the upper surface of the plate 14. The thickness 216B of the second shipping plate 210B is greater than a thickness 58B of the web 50B of the second side beam 40B, and a height 218B of the second shipping plate 210B is greater than a height 62B of the second side beam 40B.

A lower surface 220A of the first shipping plate 210A is flush with the lower surface 76A of the first side beam 40A and the respective lower surface 78 of each joist 42. Similarly, a lower surface 220B of the second shipping plate 210B is flush with the lower surface 76B of the second side beam 40B and the respective lower surface 78 of each joist 42. Because of this geometry, when the modular skid assembly 400 is moved into position on site, the lower surface 220A of the first shipping plate 210A, the lower surface 220B of the second shipping plate 210B, the lower surface 76A of the first side beam 40A, the lower surface 76B of the second side beam 40B, and the respective lower surface 78 of each joist 42 each engages the support surface of the end-use site. The first shipping plate 210A then can be released from the first side beam 40A by removing the fasteners 214, and the second shipping plate 210B can be released from the second side beam 40B by removing the respective fasteners.

In FIG. 11, each of the fasteners 214 includes a bolt threadably secured to a nut. In other embodiments, other types of fasteners can be used as fasteners 214.

The first shipping plate 210A and the second shipping plate 210B are configured for shipping and lifting heavy loads. Lift nodes 222 are provided along the length of the first shipping plate 210A, for example near upper ends of the second shipping plate and at the middle of the upper edge of the shipping plate 210A, as shown in FIG. 11. Lift nodes 222 are provided along the length of the second shipping plate 210B, for example near ends of the second shipping plate and at the middle of the upper edge of the shipping plate 210B, as shown in FIG. 11.

Figure 12:
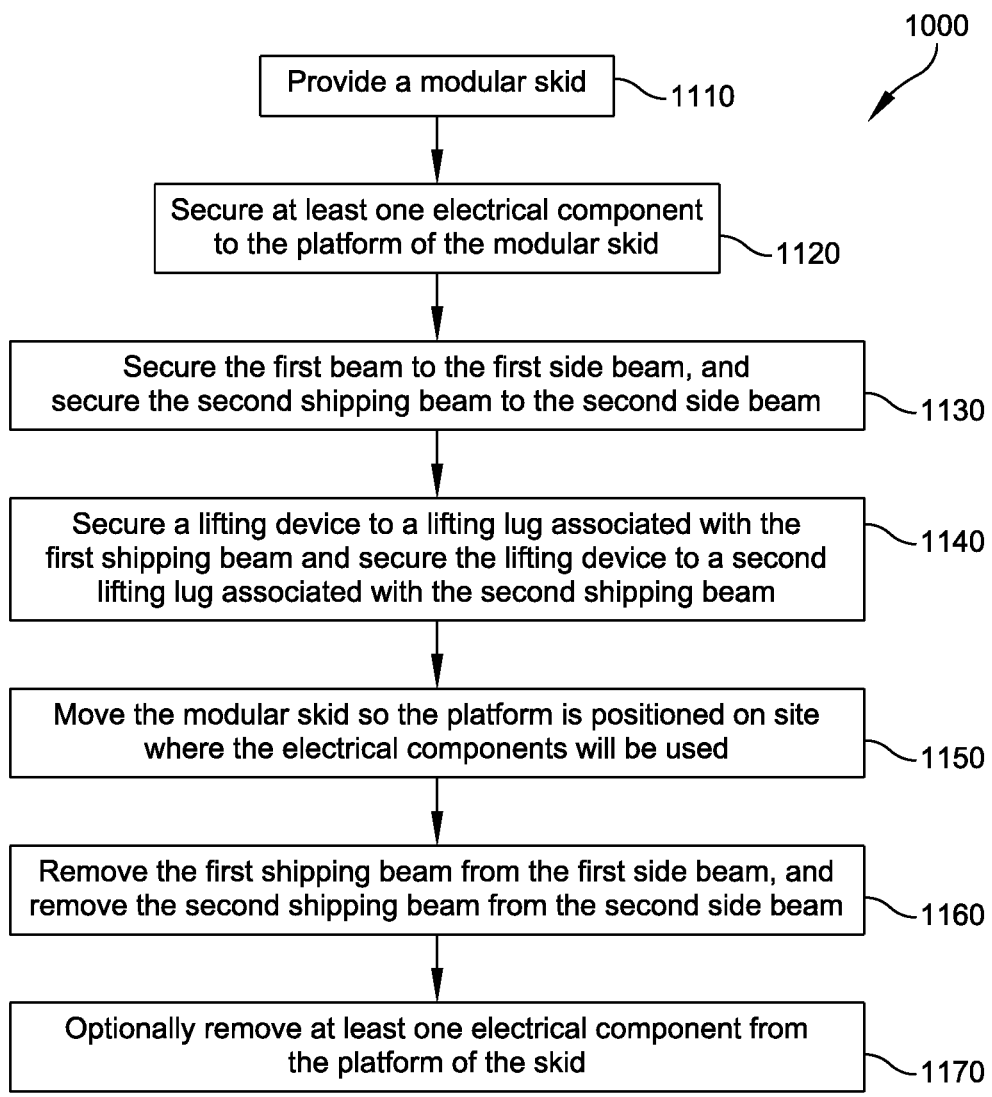
FIG. 12 is a flowchart of a method of using an embodiment of the modular skid assembly.

Another aspect of the present disclosure provides a method of transporting a modular component or several modular components. FIG. 12 shows an exemplary embodiment of a method, generally indicated at 1000, according to the present disclosure. In block 1110, a modular skid assembly is provided. The modular skid assembly is configured to transport one or more modular electrical components, and, in one embodiment, embodies the modular skid assembly 10 or the modular skid assemblies 100, 200, 300, and 400 described herein.

In block 1120, at least one modular electrical component is secured to the plate of the modular skid assembly.

In block 1130, a first shipping beam is secured to the first side beam, and the second shipping beam is secured to the second side beam. In some embodiments, another stabilizing means, such as a first shipping plate is used in place of the first shipping beam. In some embodiments, another stabilizing means, such as a second shipping plate is used in place of the second shipping beam.

In block 1140, a lifting device is secured to a first lifting lug associated with the first shipping beam and the lifting device is secured to a second lifting lug associated with the second shipping beam. The lifting device may be a crane, a hoist, or another lifting device.

In block 1150, the modular skid assembly is positioned at a site where the electrical component or the electrical components will be used.

In block 1160, the first shipping beam is removed from the first side beam, and the second shipping beam is removed from the second side beam. The first shipping beam and the second shipping beam can be reused. For example, the first shipping beam and the second shipping beam can be secured to a second platform to hoist, position, and transport the second platform to a second site.

Generally, the one or more modular electrical components are left secured to the platform. In block 1170, the modular electrical component is unsecured from the plate of the platform. In some embodiments, the electrical component is unsecured from the platform, for example, when the electrical component is replaced.

The present disclosure provides a modular skid assembly with a reduced cost, weight and height compared to previous pre-fabricated modules. The height H (FIG. 3) of the platform 12 of modular skid assembly 10 is 4.25 inches above the support surface in the exemplary embodiment. This is favorable when the plate is used to mount switchgear, to prevent the operation handle of circuit breakers from exceeding the allowable height in some operational codes.

The weight of a skid is an issue with shipping, availability of cranes, and foundation or floor loading. The reduced weight of the modular skid assembly 10 of the present disclosure improves the flexibility and speed at which platforms supporting electrical components can be installed. The modular skid assembly 10 allows increased flexibility in installation location options and allows the modular skid assembly 10 to be supported on an existing floor at a site or on a new floor at a site.

The modular skid assembly 10 of the present disclosure can reduce the cost of electrical component installation projects by roughly 5%-7% by reusing structural elements of the module. Because the stabilizing structure provides increased strength to the platform for shipping, the platform includes less steel than previous skids. The present disclosure provides a modular skid assembly 10 with a reduced structural steel cost of approximately 50% compared to previous skids.

The present disclosure provides a skid with a lower installed height, eliminating the need for extra platforms, railings and stairs. This also improves the safety of the installed equipment.

In some embodiments, the re-useable skid includes axles and wheels supported on the axles, so that the re-usable skid is formed as a trailer unit that is configured to be pulled by a truck. Such embodiments reduce the weight of the modular unit when transported on the road. In such embodiments, the wheels and axles may be removed first, then the modular unit is positioned on the site, and finally the shipping beams are removed.

In some embodiments, the entire modular skid is constructed on a trailer in a factory. The trailer is pulled by a truck to the installation site for the electrical components mounted on the modular skid. Then the modular skid is rolled off the tilting trailer into the final position at the installation site. This eliminates the need for cranes and other structures to support hoisting the modular skid.

The modular skid assembly of the present disclosure can be provided to a user as a platform and at least one stabilizing structure (for example, at least one shipping beam). In other instances, the modular skid assembly can be provided as a plurality of platforms and at least one stabilizing structure that is configured to be reused with multiple platforms. In other instances, at least one platform configured to be secured to at least one stabilizing structure can be provided to a user independently of the stabilizing structure. This is beneficial where a user already has a stabilizing structure according to the present disclosure that can be releasably secured to the platform to hoist, position, and transport the at least one platform.

A platform of the modular skid assembly of the present disclosure can be provided to a user with or without the electrical components secured to the platform.

In some embodiments, the shipping beams or shipping plates have respective lower surfaces that extend substantially below the lower surface of the platform (for example, 2 feet or 3 feet, or a distance between 2 feet and 3 feet) creating and elevated skid under which a user could run cables and bus way to interconnect the electrical equipment on the skid. When the skid is placed on site, it could drop onto piers, columns or a structure that is part of the site development to maintain the elevated space after the shipping beams or shipping plates are removed. This would allow for under-the-platform interconnection and site wiring to and from the skid. This is an alternate approach to having a raised skid with underfloor cabling, whereby the raised platform is only temporary for manufacturing and shipping.

Embodiments are not limited in their application to the details of construction and the arrangement of components set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. A modular skid assembly configured to transport at least one modular electrical component, the modular skid assembly comprising:
   a plate including an upper surface configured to support the at least one modular electrical component;
   a first side beam extending longitudinally along one side of the plate, the first side beam being secured to the plate;
   a second side beam extending longitudinally along an opposite side of the plate, the second side beam being secured to the plate;
   a plurality of joists extending laterally beneath the plate, the plurality of joists extending between the first side beam and the second side beam;
   a first shipping beam configured to be releasably secured to the first side beam; and
   a second shipping beam configured to be releasably secured to the second side beam;
   wherein a lower flange of the first shipping beam extends laterally in an opposite direction to a lower flange of the first side beam, and a lower flange of the second shipping beam extends laterally in an opposite direction to a lower flange of the second side beam.

2. The modular skid assembly of claim 1, wherein each of the first side beam and the second side beam includes a C-channel beam, and wherein each of the first shipping beam and the second shipping beam includes a C-channel beam, the first shipping beam being positioned adjacent to the first side beam and the second shipping beam being positioned adjacent to the second side beam.

3. The modular skid assembly of claim 1, wherein a lower surface of the lower flange of the first shipping beam is flush with a lower surface of the lower flange of the first side beam, and a lower surface of the lower flange of the second shipping beam is flush with a lower surface of the lower flange of the second side beam.

4. The modular skid assembly of claim 1, wherein each of the first and second side beams is welded to the plate, and each of the plurality of joists is welded to the first side beam and the second side beam.

5. The modular skid assembly of claim 1, wherein the first shipping beam is releasably securable to the first side beam via a first plurality of first fasteners, and the second shipping beam is releasably securable to the second side beam via a second plurality of second fasteners.

6. The modular skid assembly of claim 1, wherein the at least one modular electrical component is capable of being bolted to the plate.

7. The modular skid assembly of claim 1, wherein the first shipping beam and the second shipping beam each further include at least one lifting lug.

8. The modular skid assembly of claim 1, wherein the first shipping beam and the second shipping beam each further include lashing members.

9. A modular skid assembly configured to transport at least one modular electrical component, the modular skid assembly comprising:
   a plate including an upper surface configured to support the at least one modular electrical component;
   a first side beam extending longitudinally along one side of the plate, the first side beam being secured to the plate;
   a second side beam extending longitudinally along an opposite side of the plate, the second side beam being secured to the plate;
   a plurality of joists extending laterally beneath the plate, the plurality of joists extending between the first side beam and the second side beam;
   a first shipping beam configured to be releasably secured to the first side beam;
   a second shipping beam configured to be releasably secured to the second side beam; and
   a first end beam and a second end beam,
   the first end beam being secured to a first gusset that is secured to a first end of the first shipping beam, and the first end beam secured to a second gusset that is secured to a first end of the second shipping beam, the second end beam secured to a third gusset that is secured to a second end of the first shipping beam, and the second end beam secured to a fourth gusset that is secured to a second end of the second shipping beam, and each end beam secured to a respective end plate that is secured to a respective end of the plate.

10. A modular skid assembly configured to transport at least one modular electrical component, the modular skid assembly comprising:
    a plate including an upper surface configured to support the at least one modular electrical component;
    a first side beam extending longitudinally along one side of the plate, the first side beam being secured to the plate;
    a second side beam extending longitudinally along an opposite side of the plate, the second side beam being secured to the plate;
    a plurality of joists extending laterally beneath the plate, the plurality of joists extending between the first side beam and the second side beam;
    a first shipping beam configured to be releasably secured to the first side beam;
    a second shipping beam configured to be releasably secured to the second side beam;
    a first cleat formed on the first shipping beam and configured to engage a first recess defined in the first side beam when the first shipping beam is secured to the first side beam; and
    a second cleat formed on the second shipping beam and configured to engage a second recess defined in the second side beam when the second shipping beam is secured to the second side beam.

11. The modular skid assembly of claim 1, further comprising four wheels, each wheel secured to a respective one of four corners of the assembly, each wheel being vertically adjustable with respect to the plate.

12. A modular skid assembly configured to transport a at least one modular electrical component, the modular skid assembly comprising:
    a plate including an upper surface configured to support the at least one modular electrical component;
    a first side beam extending longitudinally along one side of the plate, the first side beam being secured to the plate;
    a second side beam extending longitudinally along an opposite side of the plate, the second side beam being secured to the plate;
    a plurality of joists extending laterally beneath the plate, the plurality of joists extending between the first side beam and the second side beam;
    a first stabilizing means configured to be releasably secured to the first side beam; and
    a second stabilizing means configured to be releasably secured to the second side beam,
    wherein a lower surface of the first stabilizing means is flush with a lower surface of the first side beam, and a lower surface of the second stabilizing means is flush with a lower surface of the second side beam.

13. The modular skid assembly of claim 12, wherein the first and second side beams are welded to the plate, and the plurality of joists are welded to the first side beam and the second side beam.

14. The modular skid assembly of claim 12, wherein the first stabilizing means is releasably securable to the first side beam via a first plurality of fasteners, and the second stabilizing means is releasably securable to the second side beam via a second plurality of fasteners.

15. The modular skid assembly of claim 12, wherein the at least one modular electrical component is capable of being bolted to the plate.

16. The modular skid assembly of claim 12, wherein the first stabilizing means and the second stabilizing means each further include at least one lifting lug.

17. The modular skid assembly of claim 12, wherein the first stabilizing means and the second stabilizing means each further include lashing members.

18. The modular skid assembly of claim 12, wherein the first stabilizing means is a first shipping plate and the second stabilizing means is a second shipping plate.

19. A method of transporting a modular electrical component, the method comprising:
    providing a modular skid assembly configured to transport a modular electrical component, the modular skid assembly comprising a plate including an upper surface configured to support the modular electrical component, a first side beam extending longitudinally along one side of the plate, the first side beam being secured to the plate, a second side beam extending longitudinally along an opposite side of the plate, the second side beam being secured to the plate, a plurality of joists extending laterally beneath the plate, the plurality of joists extending between the first side beam and the second side beam, a first shipping beam configured to be releasably secured to the first side beam, and a second shipping beam configured to be releasably secured to the second side beam;
    securing a modular electrical component to the plate of the modular skid assembly;
    securing the first shipping beam to the first side beam so that a lower flange of the first shipping beam extends laterally in an opposite direction to a lower flange of the first side beam; and
    securing the second shipping beam to the second side beam so that a lower flange of the second shipping beam extends laterally in an opposite direction to a lower flange of the second side beam.

20. The method of claim 19, wherein a lifting device is secured to a first lifting lug associated with the first shipping beam and to a second lifting lug associated with the second shipping beam.

21. The method of claim 19, further comprising:
    removing the second shipping beam from the second side beam, removing the first shipping beam from the first side beam.

22. The method of claim 21, further comprising unsecuring the modular electrical component from the plate.

* * * * *